(12) United States Patent  
Zhang et al.

(10) Patent No.: US 8,364,111 B2
(45) Date of Patent: Jan. 29, 2013

(54) DOWN-CONVERSION MIXER WITH SIGNAL PROCESSING

(75) Inventors: Zisan Zhang, Villach (AT); Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1057 days.

(21) Appl. No.: 12/186,139

(22) Filed: Aug. 5, 2008

(65) Prior Publication Data

US 2010/0035572 A1 Feb. 11, 2010

(51) Int. Cl.
*H04B 1/26* (2006.01)
*H04B 1/18* (2006.01)

(52) U.S. Cl. .................. 455/323; 455/285; 455/313

(58) Field of Classification Search .............. 455/285, 455/302, 313, 326, 284, 304, 305, 189.1, 455/190.1, 323; 327/358, 359
See application file for complete search history.

(56) References Cited

U.S. PATENT DOCUMENTS

| | | | |
|---|---|---|---|
| 5,124,666 A * | 6/1992 | Liu et al. | 330/253 |
| 6,263,199 B1 * | 7/2001 | Wortel et al. | 455/333 |
| 7,013,118 B2 * | 3/2006 | Darabi et al. | 455/240.1 |
| 7,062,248 B2 * | 6/2006 | Kuiri | 455/334 |
| 7,187,909 B2 * | 3/2007 | Lin et al. | 455/91 |
| 7,493,097 B2 * | 2/2009 | Ismail et al. | 455/285 |
| 2007/0004368 A1 | 1/2007 | Lee | |
| 2010/0035571 A1 * | 2/2010 | Zhang et al. | 455/323 |

FOREIGN PATENT DOCUMENTS

WO 2007/008457 A2 1/2007

* cited by examiner

*Primary Examiner* — Soony Trinh
(74) *Attorney, Agent, or Firm* — SpryIP, LLC

(57) ABSTRACT

Systems and methods for implementing a down-conversion mixer with signal processing are disclosed.

20 Claims, 8 Drawing Sheets

DOWN-CONVERSION MIXER WITH SIGNAL PROCESSING

BACKGROUND

In wireless communication systems, such as Ultra Wide Band (UWB), Wireless Local Area Network (WLAN), etc., a Radio Frequency (RF) signal undergoes processing and mixing with a local oscillator signal for down-conversion of the RF signal into a baseband signal. In traditional implementations, down-conversion of the RF signal to the baseband signal takes place in the current domain, however signal processing, such as amplification and filtering, takes place in the voltage domain. In addition, interfaces between signal processing blocks and mixing blocks are also in voltage domain in a classical RF receiver. Therefore, conversions of the baseband signal from voltage domain to current domain and vice versa usually take place several times. This can increase noise, chip area and power consumption substantially.

Recently, more and more RF transceivers used in the wireless communication systems have Very Large Scale Integration (VLSI) or even System-on-Chip (SoC) level integration, and they support multi-band and/or multi-standard operation. The signal processing blocks and multiple RF frontend blocks including mixers are integrated in a VLSI Integrated Circuit (IC). In most cases, multiple RF frontend blocks occupy a large area, and the signal processing blocks may need to be appropriately separated from the RF frontend blocks for proper floor planning. As a result, the signal processing block delivers a signal to the RF block via long wirings. The passage of the signal via long wirings can couple noises to the interface nodes, and cause high consumption of power for driving parasitic load of the long wirings.

BRIEF DESCRIPTION OF THE DRAWINGS

The detailed description is described with reference to the accompanying figures. In the figures, the left-most digit(s) of a reference numbers identifies the figure in which the reference number first appears. The same numbers are used throughout the drawings to reference like features and components.

DETAILED DESCRIPTION

Disclosed are techniques for implementing a down-conversion mixer with signal processing capabilities. A down-conversion mixer with signal processing capability can be included in the RF receiver section of communication devices, such as cellular telephones. The disclosed techniques can also be used for both IC level design and printed circuit board (PCB) level designs to reduce noise coupling, chip area, power consumption and the number of components employed in a circuit.

With the use of a Local Oscillator (LO) signal, the down-conversion mixer converts the received RF signal down into a baseband signal. At first, the RF signal is down-converted into a baseband current signal, and the resulting current signal is then processed. The processing of the baseband signal includes amplification and filtering of the baseband signal. The down-conversion mixer works on the principle of current commutating mixer (e.g., Gilbert mixer), combined with current domain signal processing proposed. After signal processing, the baseband current signal is converted to a corresponding baseband voltage signal.

The down-conversion mixer realizes each signal processing component on itself, saving chip area, lowering power consumption, and providing more flexibility in floor planning. Furthermore, interface nodes between different components are in current domain, and are not as sensitive as those in the voltage domain. Factors such as noise coupling and parasitic load effects from long wirings also have less influence on the circuitry.

Exemplary Systems

The order in which blocks of systems in the following description of exemplary block diagrams are described is not intended to be construed as a limitation, and any number of the described system blocks can be combined in any order to implement the systems, or alternate systems. Additionally, individual blocks may be deleted from the systems without departing from the spirit and scope of the subject matter described herein. Furthermore, the systems can be implemented in any suitable hardware in IC level or PCB level without departing from the scope of the invention.

Figure 1:
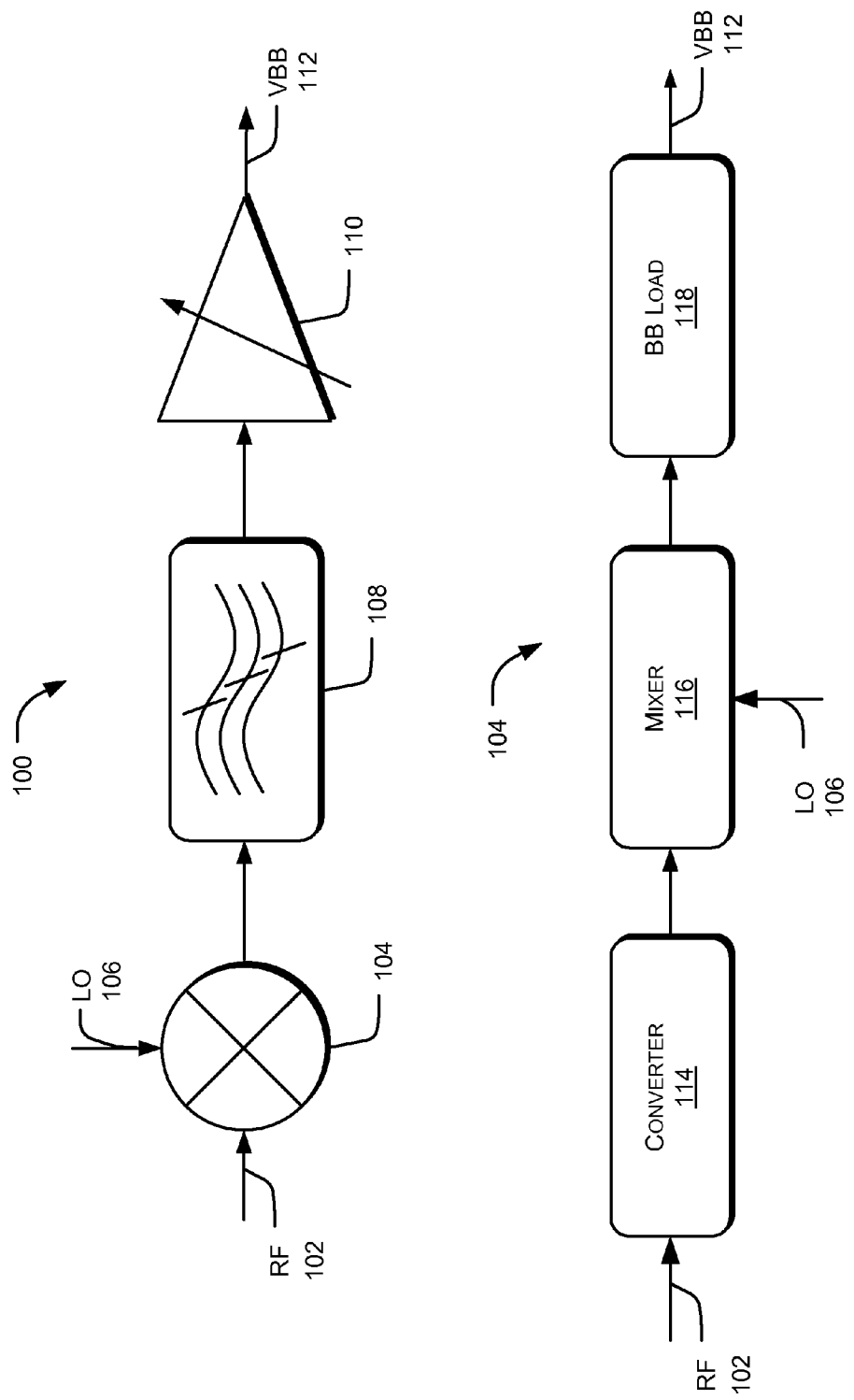
FIG. 1 are block diagrams illustrating an exemplary RF receiver section and a down-conversion mixer in a communication device.

FIG. 1 illustrates a receiver section 100 of a communication device. The RF receiver section 100 receives an RF signal 102. The RF receiver section 100 includes a down-conversion mixer 104 with a local oscillator (LO) signal 106, and signal processing blocks such as a filter 108 and a programmable gain amplifier 110. At the down-conversion mixer 104, the RF signal 102 is mixed with the LO signal 106, and the resultant baseband signal is sent to the signal processing blocks for processing. After processing, a baseband voltage signal (VBB) 112 is obtained.

FIG. 1 further illustrates a typical down-conversion mixer 104. The down-conversion mixer 104 may be a current commutating mixer, such as a Gilbert-cell mixer. The down-conversion mixer 104 includes a converter 114 that converts the RF signal 102 into a current signal. The converter 114 may include a transconductor. The RF current signal is then converted into a baseband signal in current domain. The conversion is performed via a mixer 116, which receives the LO signal 106. The mixer 116 may include a switching quad. The baseband current signal is subsequently converted into the VBB voltage signal 112 with the help of a baseband load 118.

Figure 2:
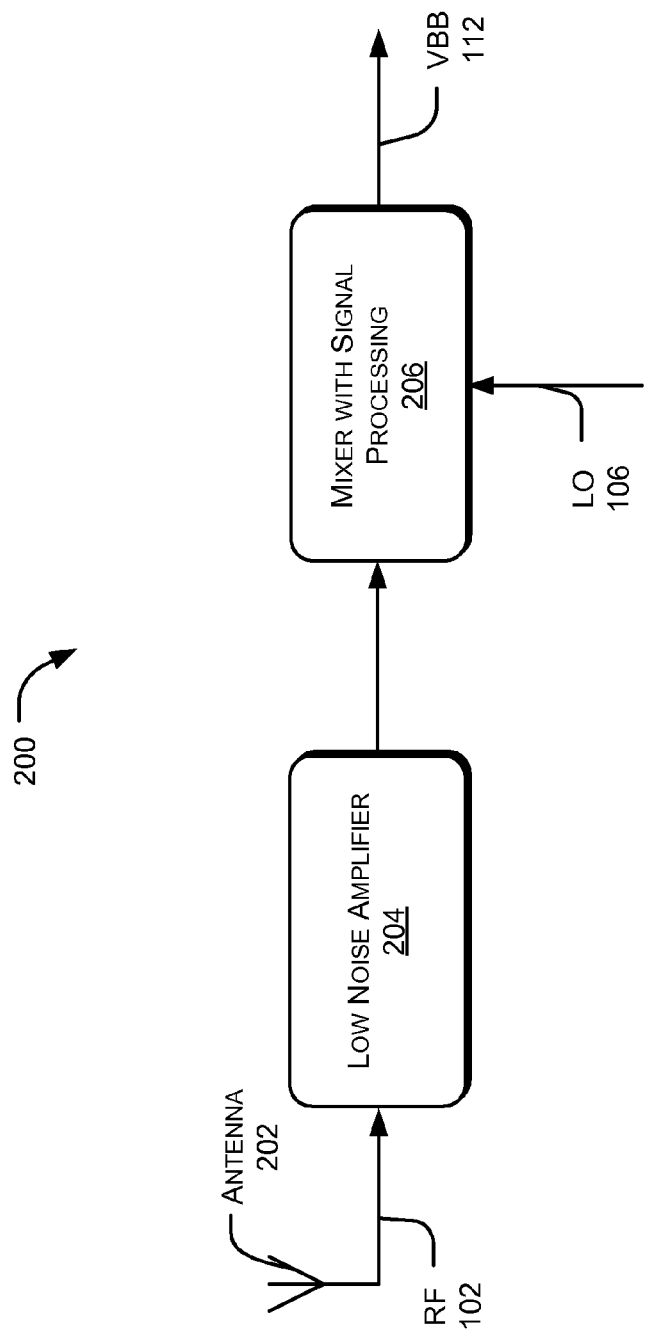
FIG. 2 is a block diagram illustrating an exemplary RF receiver section of a communication device with a down-conversion mixer with signal processing capabilities.

FIG. 2 illustrates a receiver section 200 of an exemplary wireless communication device. The receiver section 200 receives the RF signal 102 via an antenna 202. In one implementation, the RF signal 102 can be carrying audio, video, data stream, etc. For example, the RF signal 102 can be received from any other communication device or a base station. The RF signal 102 in voltage is received by a Low Noise Amplifier (LNA) 204.

The LNA 204 amplifies the RF signal 102, making the RF signal 102 suitable for further processing. The LNA 204 provides a voltage gain. The LNA 204 can additionally provide electrical impedance transformation to the RF signal 102 before further processing. The RF signal 102 is then fed to a mixer with signal processing capabilities 206, referred to as mixer 206, hereinafter.

The mixer 206 demodulates the RF signal 102 into a baseband signal. In one implementation, the mixer 206 can be a down-conversion mixer with signal processing capabilities. With use of the LO 106, the mixer 206 converts the RF signal 102 into a baseband current signal, and then process the baseband signal in current domain. The mixer 206 includes one or more current amplifiers and current-mode filters to amplify and filter the baseband current signal. After amplifying and filtering, the baseband current signal is converted to a baseband voltage signal by a programmable baseband load.

Figure 3:
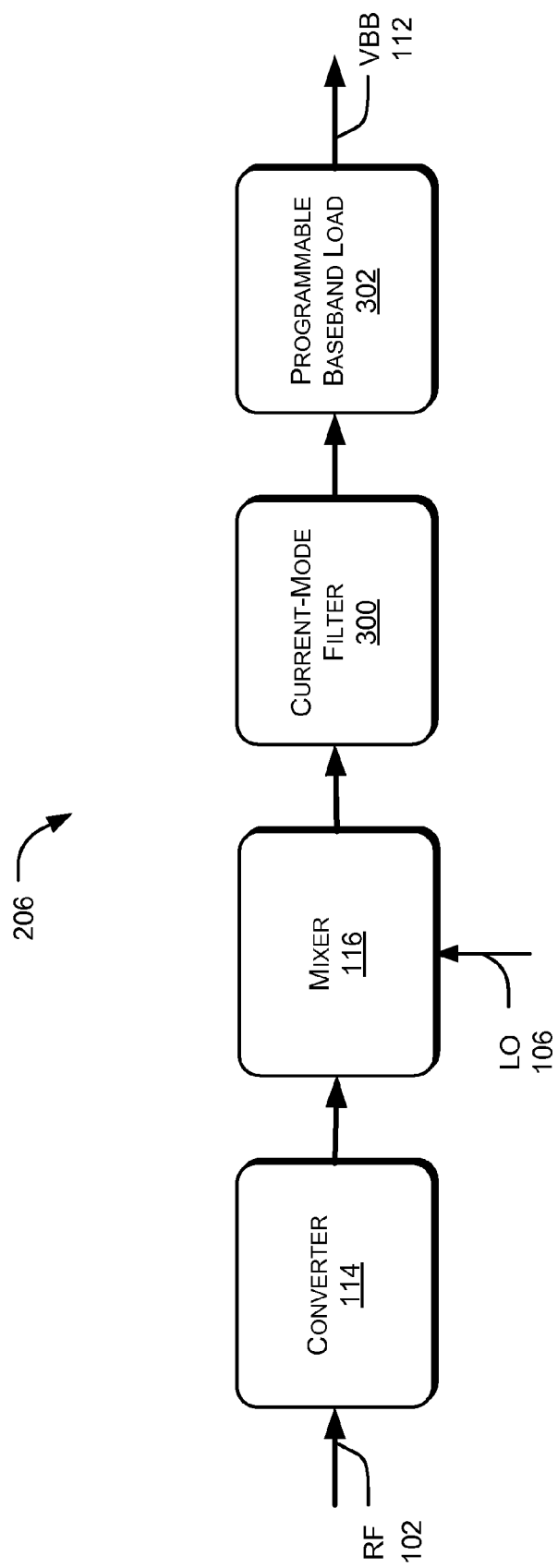
FIG. 3 is a block diagram illustrating an exemplary high voltage version of a down-conversion mixer with signal processing capabilities.

FIG. 3 illustrates an exemplary high voltage version of the mixer 206 with signal processing capabilities. In the following description, the components common with FIGS. 1 and 2 are referred to by the same names and numerals.

The RF signal 102 received via the antenna 202 feeds a converter 114. The converter 114 converts the RF signal 102 into an RF current signal. The RF current signal is then fed to the mixer 116.

At the mixer 116, the RF current signal is mixed with the LO signal 106 to generate a baseband signal in the current domain. The mixer 116 receives the LO signal 106 and demodulates the RF current signal in accordance with the LO signal 106. The LO signal 106 can be generated by a Local Oscillator (LO) generator or generation circuit (not shown). The mixer 116 can be implemented using cross-coupled differential pairs. The baseband current signal is then fed to a current-mode filter 300.

The current-mode filter 300 can be an electronic filter that filters a current signal to remove noise or any unwanted signals from the current signal. The current-mode filter 300 can be either an active filter or a passive filter. In one implementation, the current-mode filter 300 can be implemented using an intrinsic second order filter from a regulated cascode known in the art, which is further described below. The filtered baseband current signal is then sent across a programmable baseband load 302.

The programmable baseband load 302 converts the baseband current signal to the VBB signal 112. The programmable baseband load 302 can be either a switched resistor array or a variable MOS resistor. The impedance of the programmable baseband load 302 can be varied to get the required conversion of the baseband current signal to the VBB signal 112.

Figure 4:
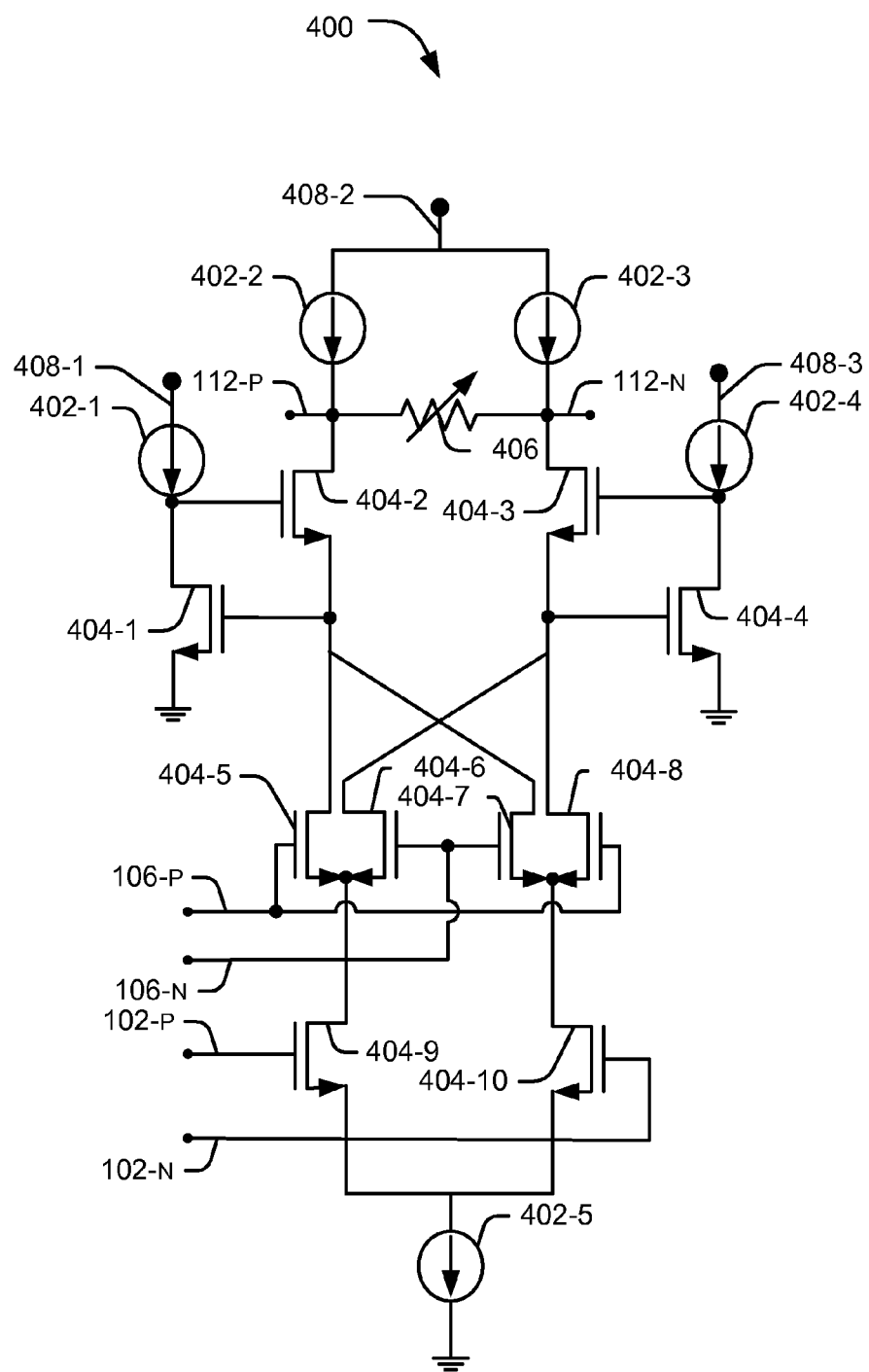
FIG. 4 is a circuit diagram of an exemplary high voltage version of a down-conversion mixer with signal processing capabilities.

FIG. 4 illustrates an exemplary circuit 400 for a high voltage version of the mixer 206. The circuit diagram is intended to explain the concept for the high voltage version of the mixer 206 at an elementary level, and the number and type of electronic components depicted in the circuit diagram does not limit the realization of the mixer 206. In the following description, the components common to FIGS. 1, 2 and 3 have been referred to by the same names and numerals.

The circuit 400 for a high voltage version of the mixer 206 includes electronic components such as transistors, current sources, resistors, voltage supply(ies), etc. In one implementation, for the high voltage version, power supply voltage is able to support 4 or more stacked transistors and/or resistors between power supply rails.

In the circuit 400, the transconductor is implemented via a differential pair realized with the help of n-channel MOSFETs 404-9 and 404-10, referred to as nMOS 404-9 and 404-10 hereinafter, and a current source 402-5. In an implementation, other type of transistors, such as bipolar junction transistors (BJT), can also be used in place of the n-channel MOSFETs. The differential pair receives the RF signal 102 as input at the gate terminals of the nMOS 404-9 and 404-10. The nMOS 404-9 receives the RF signal 102 with positive polarity, referred to as RF+ signal 102-P, while the nMOS 404-10 receives the RF signal 102 with negative polarity, referred to as RF− signal 102-N.

The differential pair converts the RF+ signal 102-P and the RF− signal 102-N into corresponding current signals. The converted current signals are then fed to the mixer 116.

The mixer 116 demodulates the RF current signals to a baseband current signal with the help of the LO signal 106. In one implementation, two cross-coupled differential pairs act as the mixer 116. The differential pairs can be realized using n-channel MOSFETs 404-5 to 404-8. In an alternate embodiment, other type of transistors, such as BJT, can also be used to realize a differential pair. The source terminals of the nMOS 404-5 to 404-8 receive the current signals. The gate terminals to the nMOS 404-5 and 404-8 receive the LO signal 106 with positive polarity, referred to as LO+ signal 106-P, while the gate terminals to the nMOS 404-6 and 404-7 receive the LO signal 106 with negative polarity, referred to as LO− signal 106-N.

The nMOS 404-5 to 404-8 form a multiplication function, multiplying the current signals from nMOS 404-9 and 404-10 with the LO signal 106. The nMOS pairs (i.e., 404-5 and 404-8, and 404-6 and 404-7) switch between themselves to provide a baseband current signal with positive polarity, and a baseband current signal with negative polarity. The baseband current signals are then fed as input to the current-mode filters.

The current-mode filters filter the current signals to remove noise or any unwanted signals. Active or passive current-mode filters known in the art can be used for filtering the current signals. In an implementation, the current-mode filters can be implemented using current-mode bi-quad filters realized using n-channel MOSFETs 404-1 to 404-4 and current sources 402-1 and 402-4 as shown. The current mode filters are explained in detail below. The filtered baseband current signals are then fed to the programmable baseband load 406.

In one implementation, the baseband load 406 can be either a switched resistor array or a variable MOS resistor, although a fixed resistor or load may be implemented in simpler systems. At the baseband load 406, the baseband current signals are converted to the baseband voltage signals, VBB 112-P and VBB 112-N.

The electronic components and the current sources in the circuit 400 are supplied power via power supplies 408-1, 408-2, and 408-3, which can be obtained from a common source. In one implementation, the power supply can be a DC supply derived from a battery or other DC source.

Figure 5:
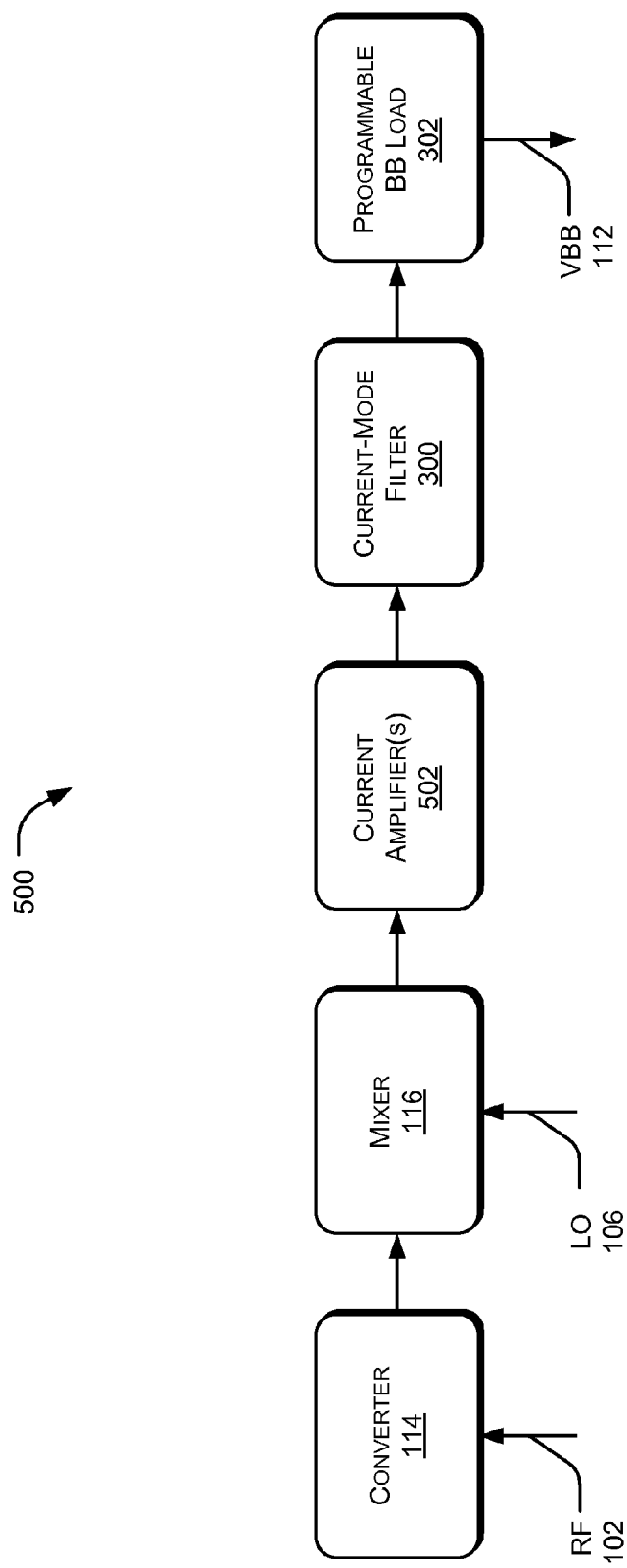
FIG. 5 is a block diagram illustrating an exemplary low voltage version of the proposed down-conversion mixer with signal processing capabilities.

FIG. 5 illustrates an implementation of a low voltage version of the mixer 206. In the following description, the components common with FIGS. 1, 2, and 3 have been referred to by the same names and numerals.

The RF signal 102, received from an input source, such as the antenna 202, feeds the converter 114. The converter 114 converts the RF signal 102 into a current signal. The current signal is then fed to mixer 116.

At the mixer 116, the current signal is mixed with the LO signal 106 to generate a baseband current signal. The mixer 116 receives the LO signal 106 and demodulates the current signal in accordance with the LO signal 106. The LO signal 106 can be generated by a Local Oscillator (LO) generation circuit (not shown). The mixer 116 can be implemented using two cross-coupled differential pairs. The baseband current signal is then fed to one or more current amplifier(s) 502.

The current amplifier(s) 502 provides amplification to the current signal as needed. Switched current mirrors can be used for implementing the current amplifier(s) 502. In an alternate embodiment, current-feedback operational amplifiers can be used as current amplifier(s) 502. The amplified current signal can then be fed to the current-mode filter 300.

The current-mode filter 300 can be an electronic filter that filters a current signal to remove noise or any unwanted signals from the current signal. The current-mode filter 300 can be either an active or a passive filter. In one implementation, the current-mode filter can be implemented using an intrinsic second order filter from a regulated cascode, which is described below. Thereafter, the baseband current signal is sent across the programmable baseband load 302.

The programmable baseband load 302 converts the baseband current signal to the VBB signal 112. The programmable baseband load 302 can be either a switchable resistor array or a variable MOS resistor, although a fixed resistor or load may be implemented in simpler systems. The programmable baseband load 302 can be adjusted to obtain the required amplitude of VBB signal 102.

Figure 6:
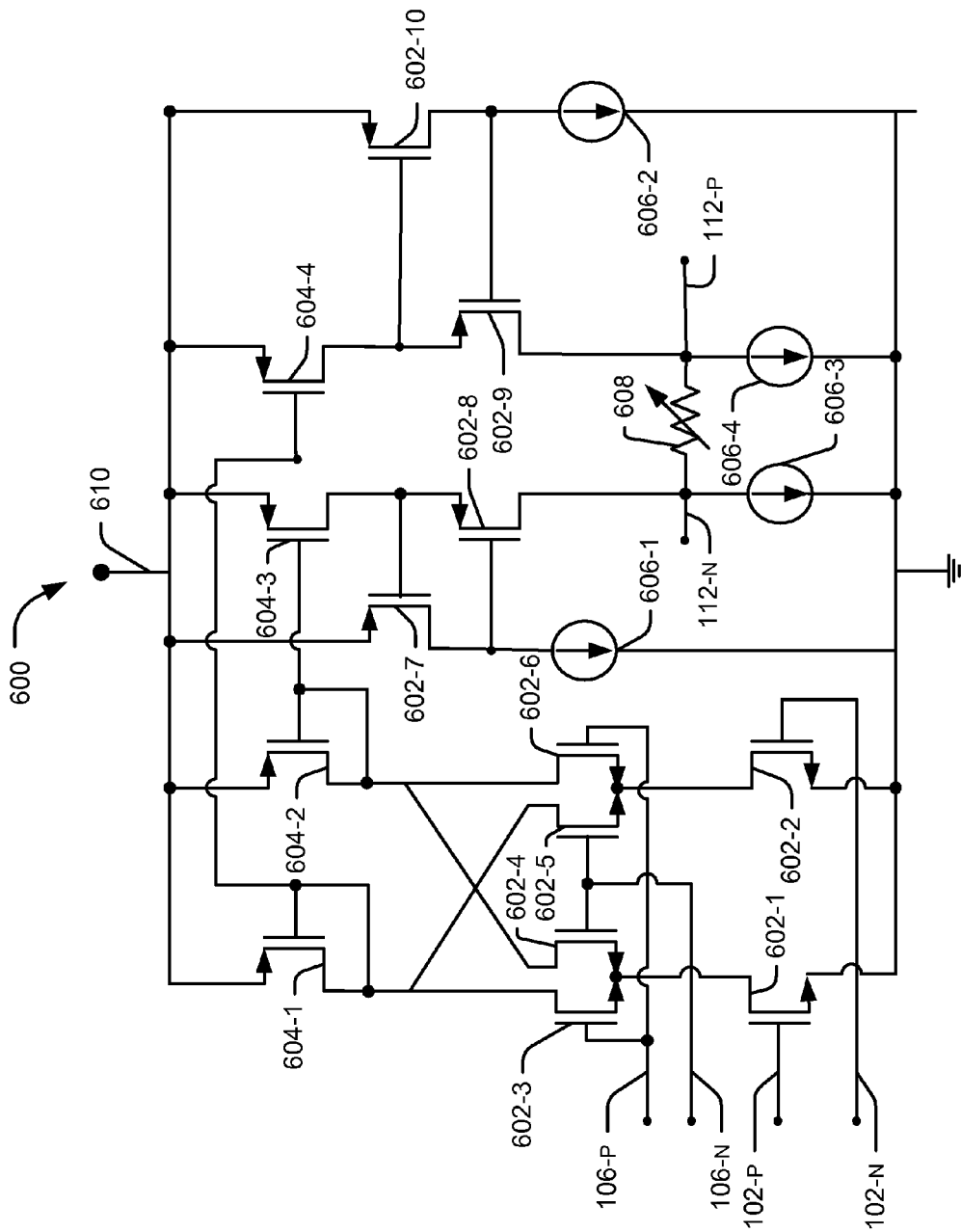
FIG. 6 is a circuit diagram illustrating an exemplary low voltage version of the proposed down-conversion mixer with signal processing capabilities.

FIG. 6 illustrates an exemplary circuit for a low voltage version of the mixer 206. The circuit diagram is intended to explain the concept for the low voltage version of the mixer 206 at an elementary level, and the number and type of electronic components depicted in the circuit diagram does not limit the realization of the mixer 206. In the following description, the components common with FIGS. 1 to 5 are referred to by the same names and numerals.

The circuit 600 for a low voltage version of the mixer 206 includes electronic components such as transistors, current sources, resistors, voltage supply, etc. In an implementation, for the low voltage version, the power supply voltage is able to support maximum 3 stacked transistors between the power supply rails.

In the circuit 600, the converter 114 that is implemented via a pseudo differential pair realized with the help of n-channel MOSFETs 602-1 and 602-2, referred to as nMOS 602-1 and 602-2 hereinafter. In an implementation, any other type of transistors, such as BJT, can also be used in place of the n-channel MOSFETs. The RF signal 102 is received as input at the gate terminals of the nMOS 602-1 and 602-2. The nMOS 602-1 receives the RF signal 102 with positive polarity, referred to as RF+ signal 102-P, while the nMOS 602-2 receives the RF signal 102 with the negative polarity, referred to as RF− signal 102-N.

The pseudo differential pair converts the RF+ signal 102-P and RF− signal 102-N into corresponding current signals. The current signals obtained are then fed to a switching quad.

In one implementation, two cross-coupled differential pairs act as the mixer 116. In an alternate embodiment, other type of transistors, such as BJT, can also be used to realize a differential pair. The source terminals of nMOS 602-3 to 602-6 receive the current signals. The gate terminals to the nMOS 602-3 and 602-6 receive the LO signal 106 with positive polarity, referred to as the LO+ signal 106-P, while the gate terminals to the nMOS 602-4 and 602-5 receive the LO signal 106 with negative polarity, referred to as the LO− signal 106-N.

The nMOS 602-3 to 602-6 form a multiplication function, multiplying the RF signals with the LO signal 106. The nMOS pairs (i.e., 602-3 and 602-6, and 602-4 and 602-5) switch between themselves to provide a baseband current signal with positive polarity, and a baseband current signal with negative polarity. Thus, the RF current signals are demodulated to baseband current signals with the help of the local oscillator signal LO 106, and the baseband current signals are then sent to one or more current amplifier(s).

Current amplifier(s) 502 can be realized using switched current mirrors or current-feedback operational amplifiers. In one implementation, the current signal received from the nMOS 602-1 can be fed to a current mirror realized with transistors pMOS 604-1 and 604-3. The current signal from the nMOS 602-2 can then be fed to a current mirror realized with transistors pMOS 604-2 and 604-4. The current mirrors amplify the baseband current signals depending upon the mirror ratio of the transistors pMOS 604-1 to 604-4. In an alternate embodiment, nMOS current mirrors can be used in place of pMOS current mirrors. After amplification, the current signals can be fed to the current-mode filters 300.

In an implementation, the current-mode filters 300 can be implemented using current-mode bi-quad filters realized using n-channel MOSFETs 602-7 to 602-10 and current sources 606-1 and 606-2. The current-mode filters 300 filter the current signals to remove noise or any unwanted signals. Any active or passive current-mode filter known in the art can be used for filtering the current signals. The current mode filters are explained in detail later. The filtered baseband current signals are then fed to the programmable baseband load 302 realized with the help a variable resistor 608.

The variable resistor 608 connected at the drain terminals of the nMOS 602-8 and 602-9 can be adjusted to increase or decrease amplitude of the VBB signal 112. In an alternate embodiment, a variable MOSFET resistor or a switchable resistor array can be used in place of the variable resistor 608.

Referring back to FIG. 3, at the programmable baseband load 302, the baseband current signals are converted to the baseband voltage signals VBB 112-P and VBB 112-N. In one implementation, the programmable baseband load 302 can be either a switched resistive or a variable MOS resistor.

Now referring back to FIG. 6, the electronic components and the current sources in the circuit 600 are supplied power via a power supply voltage 610. The power supply voltage 610 can be obtained from a DC supply derived from a battery or any other DC source (not shown).

Figure 7:
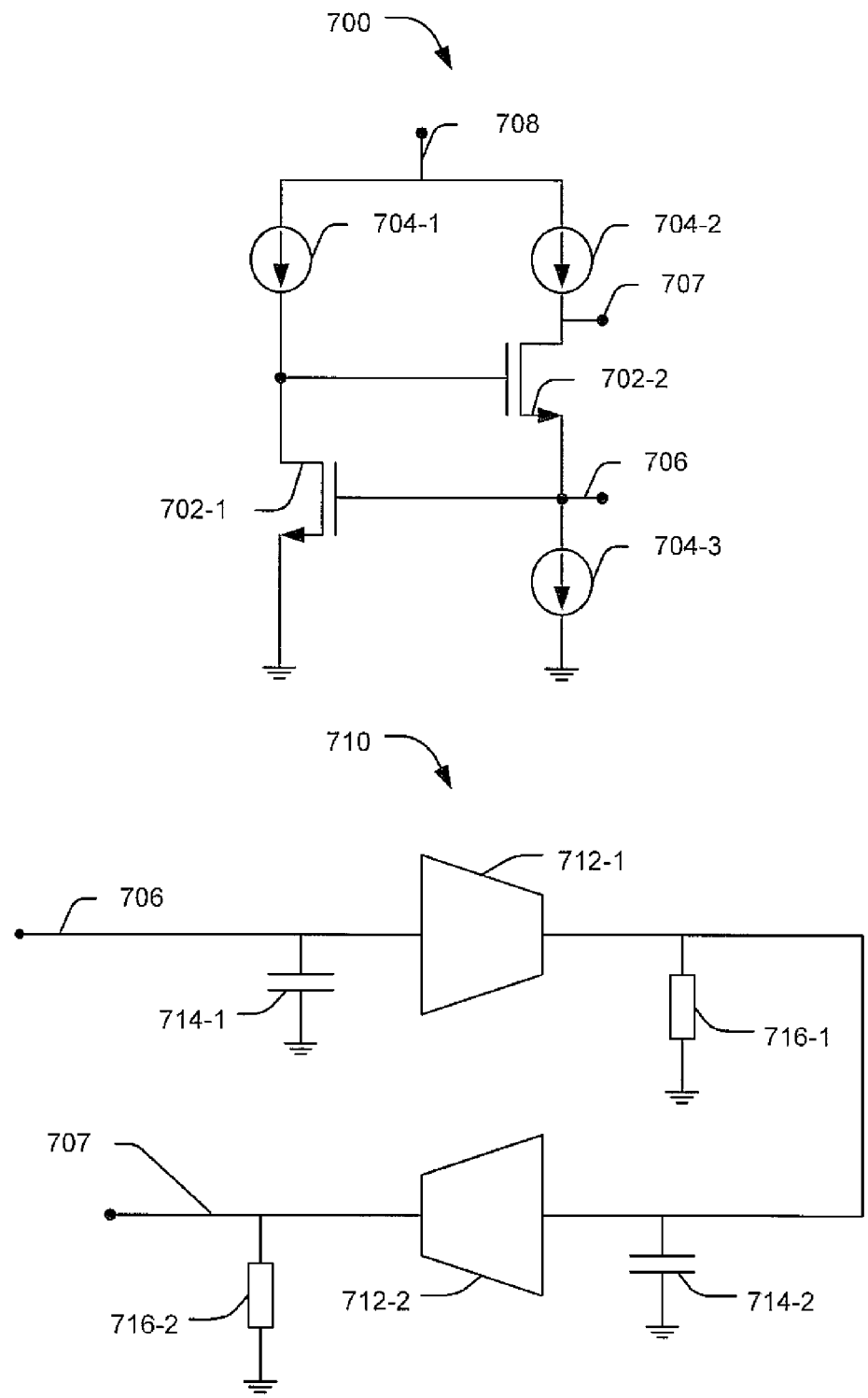
FIG. 7 are circuit diagrams of exemplary current mode filters.

FIG. 7 illustrates an exemplary implementation of the current-mode filter. In one implementation, the current-mode filter 300 can be implemented by a current-mode bi-quad filter 700. The current-mode bi-quad filter 700 can be a second order low-pass filter. The current-mode bi-quad filter 700 can be realized using n-channel MOSFET(s) 702-1 and 702-2, referred to as nMOS 702-1 and 702-2 hereinafter, and current sources 704-1 to 704-3. The transconductance of nMOS 702-1 and 702-2 together with their gate to source capacitance are used as a second order filter current mode filter. The baseband current signal 706 can thereby be filtered in the current domain, thus producing a filtered signal 707.

The electronic components and the current sources in the circuit 700 are supplied power via a power supply voltage 708. The power supply voltage 706 can be a DC supply derived from a battery or other DC source.

FIG. 7 also shows another exemplary implementation of the current-mode filter 300. The current mode filter 300 can be implemented as a filter 710. The filter 710 can be realized with the help of operational transconductance amplifiers (OTA) 712-1 and 712-2; capacitor(s) 714-1 and 714-2; output resistances 716-1 and 716-2. The baseband current signal 706 can be filtered in a manner similar to that described above with reference to circuit 700, thus producing the filtered signal 707.

Exemplary Method

Figure 8:
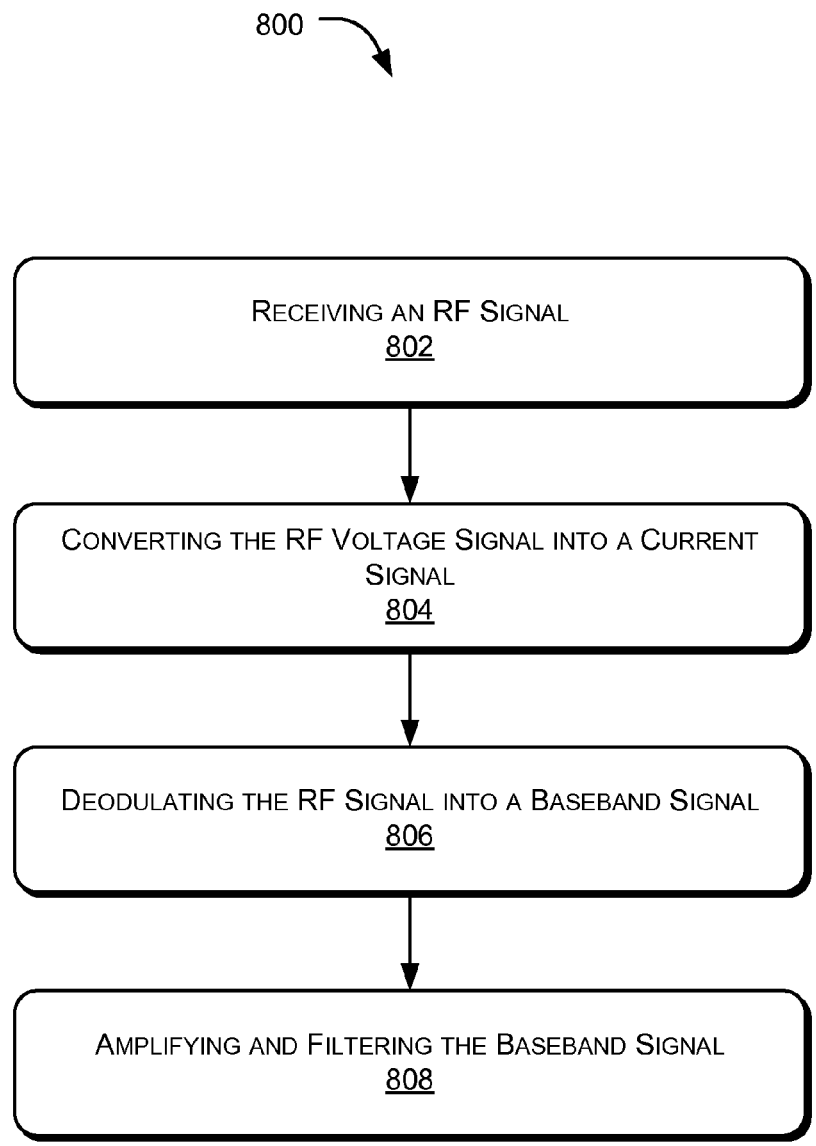
FIG. 8 is a flowchart of an exemplary method for implementing the proposed down-conversion mixer with signal processing capabilities.

FIG. 8 illustrates an exemplary method for implementing a down-conversion mixer with signal processing capabilities. The order in which the method is described is not intended to be constructed as a limitation, and any number of the described method blocks can be combined in any order to implement the method, or alternate method. Additionally, individual blocks may be deleted from the method without departing from the spirit and scope of the subject matter described herein.

At block 802, an RF voltage signal is received as an input for down-conversion. In an implementation, the receive section of a communication device, such as a cell phone, receives the RF signal 102. The RF signal 102 is processed and fed to the down-conversion mixer 206. Therefore, the RF signal 102 is down-converted to a baseband signal at the mixer 206.

At block 804, the RF voltage signal is converted into a current signal. In one implementation, the RF signal 102 is converted into a current signal by the converter 114 included in the mixer 206.

At block 806, the RF signal is demodulated into a baseband signal, with the use of a local oscillator (LO) signal. In one implementation, the RF current signal is fed to the mixer 116. At the mixer 116, the RF current signal is mixed with the LO signal 106 to generate a baseband current signal. The mixer 116 receives the LO signal 106 and demodulates the RF current signal in accordance with the LO signal 106. The LO signal 106 can be generated by a Local Oscillator generation circuit. The mixer 116 can be implemented using cross-coupled differential pairs.

At block 808, the baseband current signal is amplified and filtered. In one implementation, the current signal can be amplified using one or more current amplifiers. The current amplifier(s) 502 provides amplification to the current signal as required. Switched current mirrors can be used for implementing the current amplifier(s) 502. In an alternate embodiment, current-feedback operational amplifiers can be used as current amplifier(s) 502. The amplified current signal can then be fed to the current-mode filter 300.

The current-mode filter 300 can be an electronic filter that filters the current signal to remove noise or any unwanted signals from the current signal. The current-mode filter 300 can be either an active filter or a passive filter. In one implementation, the current-mode filter can be implemented using an intrinsic second order filter from a regulated cascode.

The baseband current signal is sent across the programmable baseband load 302 where it is converted into the VBB signal 112.

CONCLUSION

Although embodiments for a down-conversion mixer with signal processing have been described in language specific to structural features and/or methods, it is to be understood that the appended claims are not necessarily limited to the specific features or methods described. Rather, the specific features and methods are disclosed as exemplary implementations for the down-conversion mixer with signal processing.

What is claimed is:

1. A down-conversion mixer with signal processing capabilities comprising:
    a converter that converts a radio frequency (RF) signal into a current signal;
    a mixer that receives the current signal, mixes the current signal with a local oscillator signal, and generates a baseband signal;
    a current-mode filter that receives the baseband signal, and generates a filtered signal; and
    a load that converts the filtered signal into a baseband voltage signal.

2. The down-conversion mixer of claim 1, wherein the converter is implemented as a differential pair comprised of MOSFETs.

3. The down-conversion mixer of claim 1, wherein the mixer includes two cross-coupled differential pairs using n-channel MOSFETs.

4. The down-conversion mixer of claim 1, wherein the local oscillator signal is generated by a LO generation block.

5. The down-conversion mixer of claim 1, wherein the current-mode filter is one of an active or passive filter that removes noise and unwanted signals from the current signal.

6. The down-conversion mixer of claim 1, wherein the current-mode filter is a second order filter of a regulated cascode.

7. The down-conversion mixer of claim 1, wherein the baseband voltage signal is obtained by programmable current amplifier or programmable baseband load.

8. The down-conversion mixer of claim 7, wherein the programmable baseband load can be either a switched resistor array or a variable MOS resistor.

9. The down-conversion mixer of claim 1 further comprising a current amplifier that amplifies the current signal.

10. A device implementing down-conversion mixer with signal processing capabilities comprising:
    a Low Noise Amplifier (LNA) that receives and amplifies a radio frequency (RF) signal; and
    a mixer that demodulates the RF signal into a baseband signal comprised of:
    1) a converter that converts the RF signal into a current signal;
    2) a first component that mixes the RF signal with a local oscillator signal;
    3) a second component that filters the baseband signal in current domain; and
    4) a third component that adjusts the amplitude of the baseband signal and outputs a voltage signal.

11. The device of claim 10, wherein the converter is implemented as a differential pair that includes a pair of transistors.

12. The device of claim 10, wherein the first component is a mixer that receives the current signal.

13. The device of claim 12, wherein the mixer includes two cross-coupled differential pair transistors.

14. The device of claim 10, wherein the second component is a current-mode filter that receives the baseband signal, and generates a filtered signal.

15. The device of claim 10, wherein the second component further includes a programmable current mirror that adjusts the baseband signal.

16. The device of claim 10, wherein the second component further includes a programmable baseband load that adjusts the baseband signal.

17. The device of claim 10, wherein the down-conversion mixer is further comprised of a current amplifier that amplifies the baseband current signal.

18. A method of down-converting a radio frequency (RF) signal into a baseband signal with signal processing comprising:
    receiving the RF signal for down-conversion;
    converting the RF signal from a voltage signal to a current signal;
    demodulating the RF signal with the help of a local oscillator signal;
    generating the baseband signal from the demodulation;
    filtering the baseband signal in current domain; and
    processing the baseband signal over a load.

19. The method of claim 18, wherein the processing the baseband signal is performed using a variable load.

20. The method of claim 18 further comprising amplifying the baseband signal from the filtering.

* * * * *